United States Patent [19]
Takimoto et al.

[11] Patent Number: 5,544,068
[45] Date of Patent: Aug. 6, 1996

[54] SYSTEM AND METHOD FOR OPTIMIZING DELAYS IN SEMICONDUCTOR CIRCUITS

[75] Inventors: Misao Takimoto, Hadano; Tooru Hiyama, Atsugi; Tetsuo Sasaki, Hadano; Tatsuki Ishii, Tokyo, all of Japan

[73] Assignee: Hitachi, Ltd., Kanagawa-ken, Japan

[21] Appl. No.: 209,331

[22] Filed: Mar. 9, 1994

[30] Foreign Application Priority Data

Mar. 9, 1993 [JP] Japan ................................. 5-048097

[51] Int. Cl.⁶ ..................................................... G06F 17/50
[52] U.S. Cl. ............................................. 364/489; 364/490
[58] Field of Search ...................................... 364/488, 489, 364/490, 578

[56] References Cited

U.S. PATENT DOCUMENTS

| | | | |
|---|---|---|---|
| 4,698,760 | 10/1987 | Lembach et al. | 364/490 |
| 5,038,294 | 8/1991 | Arakawa et al. | 364/491 |
| 5,095,454 | 3/1992 | Huang | 364/578 |
| 5,133,069 | 7/1992 | Asato et al. | 364/489 |
| 5,197,015 | 3/1993 | Hartoog et al. | 364/490 |
| 5,235,521 | 8/1993 | Johnson et al. | 364/489 |
| 5,274,568 | 12/1993 | Blinne et al. | 364/489 |
| 5,359,535 | 10/1994 | Djaja et al. | 364/489 |

OTHER PUBLICATIONS

"Switch-Level Delay Models for Digital MOS VLSI" by J. K. Ousterhout, IEEE 21st Design Automation Conference, 1984, pp. 542–548.

"Analytical Power/Timing Optimization Technique for Digital System" by A. E. Ruehli et al. IEEE 14th Design Automation Conference, 1977, pp. 142–146.

"Optimization of Digital MOS VLSI Circuits" by M. D. Matson, IEEE—Chapel Hill Conference 1985, pp. 109–126.

*Primary Examiner*—Vincent N. Trans
*Attorney, Agent, or Firm*—Jenner & Block

[57] ABSTRACT

A control device and a storage device are provided. The storage device has a clock signal file for determining a delay reference value for a path, and a logic information file for holding description of elements in the path. The control device refers to the clock signal file and the logic information file to determine an combination of the emitter-follower current and the value of the current-switch current of a certain element in the path.

6 Claims, 12 Drawing Sheets

SYSTEM AND METHOD FOR OPTIMIZING DELAYS IN SEMICONDUCTOR CIRCUITS

FIELD OF THE INVENTION

This invention relates to a system for designing semiconductor integrated circuits which have signal transmission passageways comprising circuit elements interconnected by conducting lines.

BACKGROUND OF THE INVENTION

A gate-array type integrated circuit is a semiconductor device which has basic circuit elements arranged in a pattern on a chip (the "master slice"). The circuit elements can be interconnected during manufacture to achieve a desired functionality. Thus, a gate array can be customized.

Circuit elements typically found in a gate array include storage elements, such as latches, and logic elements, such as AND gates. A "path" is defined as a signal transmission passageway between and including circuit elements. There are various types of paths. For example, there are closed paths between storage elements; open paths from a storage element to an output terminal or from an input terminal to a storage element; and through paths from an input terminal to an output terminal. The "input" and "output" terminals are external terminals (or "leads") of the semiconductor circuit device.

FIG. 11 illustrates sample paths (1) through (4). For example, path (1) includes latches 901 and 902 and gates 909 and 910. Wire portions 917, 918 and 919 connect these elements as illustrated. Each element and wire has an inherent capacitance, which causes a propagation delay as the signal moves from latch 901 to latch 902. These delays are illustrated in the bar graphs of FIGS. 15 and 16. The portion of the propagation delay attributable to each particular element or wire portion is designated in FIGS. 15 and 16 by boxes bearing the reference numeral of the particular element or wire portion.

As shown in FIG. 11, latches 901 and 902 receive timing signals $T_0$ and $T_1$, respectively. It is essential that the signal propagate from latch 901 to latch 902 during the interval between timing signals (the "delay reference value"). Otherwise, the signal will not have reached latch 902 by the time latch 902 is strobbed by timing signal $T_1$. The delay reference value is shown in FIGS. 15 and 16 by a broken line.

As can be seen in FIG. 15, some paths, such as path (4), have propagation delays which exceed the delay reference value. Others, such as path (3), have propagation delays which are less than the delay reference value. As is known, the current between elements can be varied to adjust the propagation delay attributable to the capacitive effects of the wire portions. Specifically, the greater the current, the shorter the propagation delay.

To control flow of current between elements, each element includes at its output an emitter-follower circuit, comprised of a plurality of resistors and transistors. As explained in Japanese Post-Examination Application No. 64-4340, these resistors and transistors are selectively coupled to obtain an emitter-follower circuit having the desired current characteristic. By increasing current, the propagation delays can be shortened, so that the aggregated delays for a given path do not exceed the delay reference value.

The conventional method of varying an emitter-follower current in accordance with the capacitance of a load circuit will be described with reference to FIGS. 11, 15 and 16. As explained above, FIG. 15 shows the delays in the paths (1)–(4) of FIG. 11 before emitter-follower current is adjusted. The delays illustrated in FIG. 15 include delays in elements and delays on signal lines. FIG. 16 shows the delays after the emitter-follower current has been adjusted in accordance with conventional techniques.

For example, consider paths (1) and (2) of FIG. 11. Both paths (1) and (2) have the same number of elements. However, signal line 921 of path (2) is longer than signal lines 917–919 of path (1). Effective capacitance (that is, delay) caused by line 921 is larger than that caused by lines 917–919. Thus, the overall delay of path (2) is greater than the delay of path (1), as shown by the bar graphs of FIG. 15. By increasing the emitter-follower current of a logic element 911, the delay can be shortened, as shown in FIG. 16.

In the conventional method, such an adjustment is conducted to all long signal lines, which sometimes causes an unnecessary increase of power consumption. For example, (3) of FIG. 11 includes a long line 923. However, because path (3) has few elements, its overall delay is less than the delay reference time, as shown in FIG. 3. Nevertheless, in accordance with conventional practice, the emitter-follower current of storage element 905 is increased, thus reducing the overall delay of path (3) further below the delay reference time (as shown in FIG. 16), and resulting in additional unnecessary power consumption.

Path (4) of FIG. 11 includes three elements 914–916 and three short lines 925–928. Because signal lines 925, 926 and 928 are short, their effective capacitances are small. Increasing the emitter-follower current of elements 915 cannot sufficiently reduce the delay of line 927, and it is impracticable to reduce delay on short lines 925, 926 and 928. Therefore, even after adjustment, the delay of path (4) exceeds the delay reference value.

Thus, the conventional technique simply adjusts the emitter-follower current of each element in accordance with the capacitance of the load circuit associated with that element. When the capacitance of the load circuit is large, the element's emitter-follower current is increased, even through the element's path may already have a sufficiently short delay. On the other hand, when the capacitance of the load circuit is small, the current value is not altered, even though the element may be part of a path which has an aggregate delay that exceeds the delay reference value.

As described above, the conventional technique reduces the delay between the elements having large capacitive loads. Therefore, the delay of certain individual elements may be reduced. The conventional technique is not effective, however, for reducing the delay in paths which have a larger number of elements connected by short signal lines. Therefore, the speed of the whole semiconductor circuit is limited by the path having the longest delay, and thus limiting the overall speed of the integrated circuit.

Further, the conventional method does not reduce the delays attributable to the elements, themselves, as opposed to the delay attributable to the lines between elements. Further, the conventional method does not minimize power consumption.

SUMMARY OF THE INVENTION

An object of this invention is to provide a delay control system for optimizing the delays of signal paths and reducing the deviation of the delay from the delay reference line. The optimal delay is one closest to (without exceeding) the delay reference value.

A further object of this invention is to provide a delay control system for increasing operation speed of the semiconductor integrated circuit.

A further object of this invention is to provide a delay control system for reducing the power consumption of the circuit.

Yet a further object of this invention is to provide a delay control system for a semiconductor integrated circuit by selecting a combination of the emitter-follower and current-switch currents for each path.

In order to attain the above objects, a delay optimizing system for a semiconductor integrated circuit has a control device and a storage device, wherein the storage device has a clock signal table for determining a delay reference value for a path serving as a reference for delay control, and a logic information table for holding connection and electrical current information for each element. The control device refers to the clock signal table and the logic information table to determine an element for which the delay reference value and the current value should be altered, and then determines the new values of the emitter-follower current and/or the current-switch current of the element so that the delay of each path is equal to the delay reference value, or is lower than and near to the reference value.

BRIEF DESCRIPTION OF THE DRAWINGS

With the above and other objects in view, as many appear hereinafter, reference is directed to the accompanying drawings in which.

DETAILED DESCRIPTION OF THE PREFERRED EMBODIMENT

Embodiments of this invention will be hereunder described with reference to the drawings.

Figure 9:
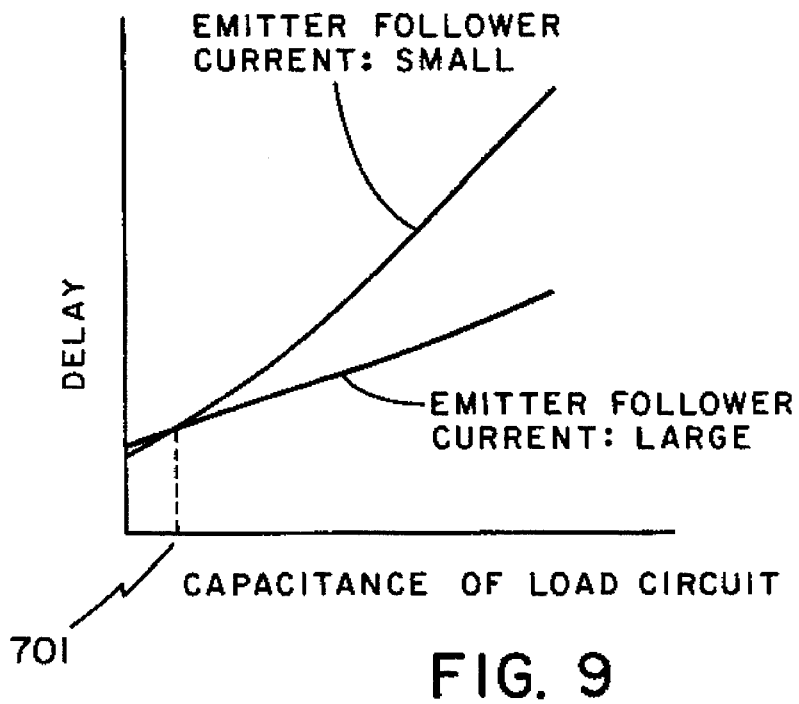
FIG. 9 is a graph of load circuit capacitance versus delay for both large and small emitter-follower current.

FIG. 9 shows the relationship between the delay and the capacitance of a load circuit of a typical element in accordance with intensity of an emitter-follower current. When the capacitance of the load circuit is larger than a cross point 701, the delay is shortened by increasing the emitter-follower current. When the capacitance of the load circuit is smaller than the cross point 701, the delay is shortened by decreasing the emitter-follower current. One of the main reasons for this is because the more the emitter-follower current increases, the more base current of the emitter-follower transistor is required. Another reason is that, the more the current is increased, the larger the emitter transistor must be. Such a large transistor has a large load capacity and consumes more power.

Figure 10:
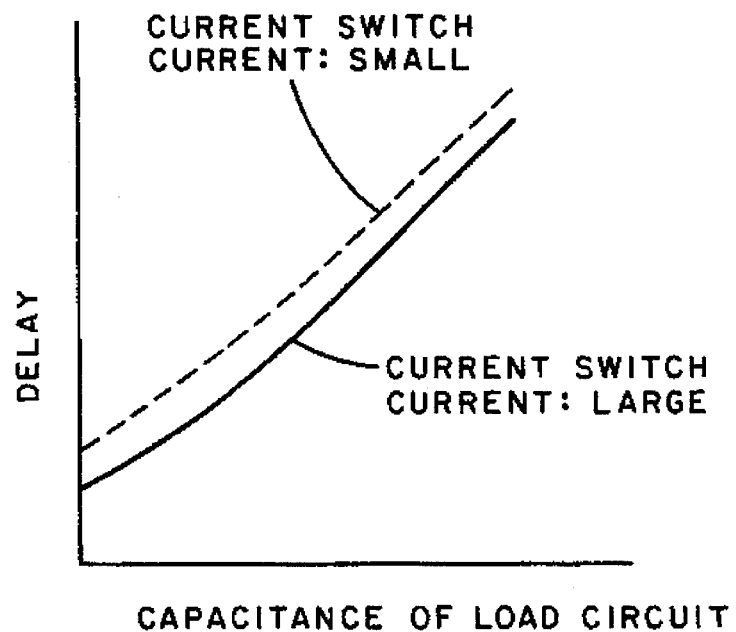
FIG. 10 is a graph of load circuit capacitance versus delay for both large and small current-switch current.

FIG. 10 shows the relationship between the delay and the capacitance of the load circuit of a typical element in accordance with the intensity of the current-switch current, as the current-switch current is increased, the delay is uniformly increased.

Figure 1:
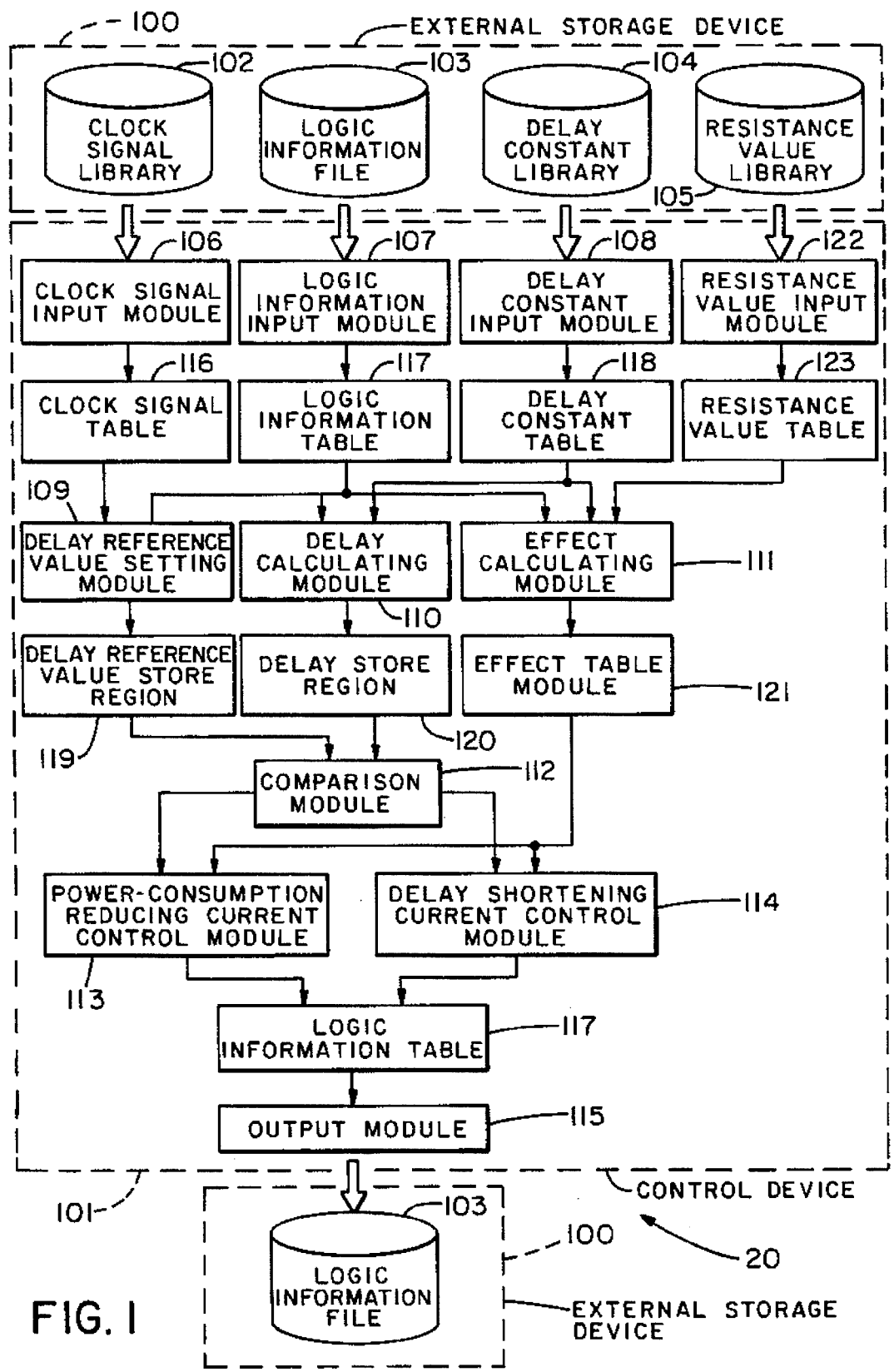
FIG. 1 is a block diagram of a design system in accordance with the invention.

FIG. 1 shows a delay optimizing system 20 for designing semiconductor integrated circuits in accordance with the invention. Delay optimizing system 20 of this embodiment has external storage device 100 and a control device 101. Control device 101 is a computer, including a central processing unit and a primary storage unit (not illustrated).

The external storage device 100 includes a clock signal library 102, a logic information file 103, a delay constant library 104, and resistance value library 105, which are explained below in detail. Generally, these libraries hold information describing the integrated circuit which is being designed. Control device 101 executes computer programs to implement modules, including a clock signal input module 106, a logic information input module 107, a delay constant input module 108, a resistance value input module 122, a delay reference value setting module 109, a delay calculating module 110, an effect calculating module 111, a comparison module 112, a power-consumption reducing current control module 113, a delay shortening current control module 114, and an output module 115, and repetitive processing control (not shown).

Control device 101 also maintains several tables and variables in its primary storage unit, namely a clock signal table 116, a logic information table 117, a delay constant table 118, a delay reference value storing region 119, a delay storing region 120, an effect table 121 and a resistance value table 123.

As explained below, in system 20, libraries 102–105 are used as input sources. The control device 101 determines an element for which the current values should be altered, determines the values of an emitter-follower current and a current-switch current of the element, and outputs the new values back to the logic information library 103.

Clock signal library 102 holds: (a) clock signal names, (b) signal periods, (c) phase differences (as measured from a reference clock signal), and (d) delay reference values between clock signals. Logic information library 103 holds: (a) the identity of a clock signal applied to each storage element, (b) the connective relation between elements in each path, (c) the values of the emitter-follower current and the current-switch current of each element and (d) a delay target value including a propagate reference value (path from A01 to A02, FIG. 12) and an external delay reference value (wiring from A05 to A06, FIG. 12) for each path which is previously set in a super-ordinate hierarchy. Delay constant library 104 holds a plurality of constant values required to calculate the delay between particular elements.

Figure 7:
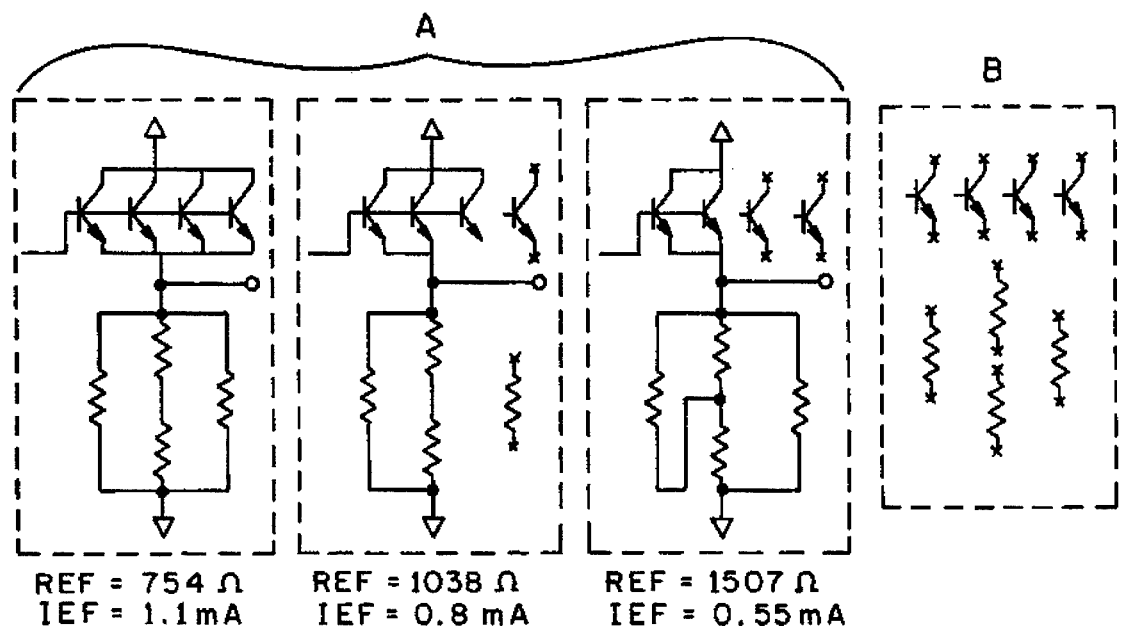
FIG. 7 is a diagram showing various alternative configurations of the emitter-follower circuit shown in FIG. 6.
Figure 8:
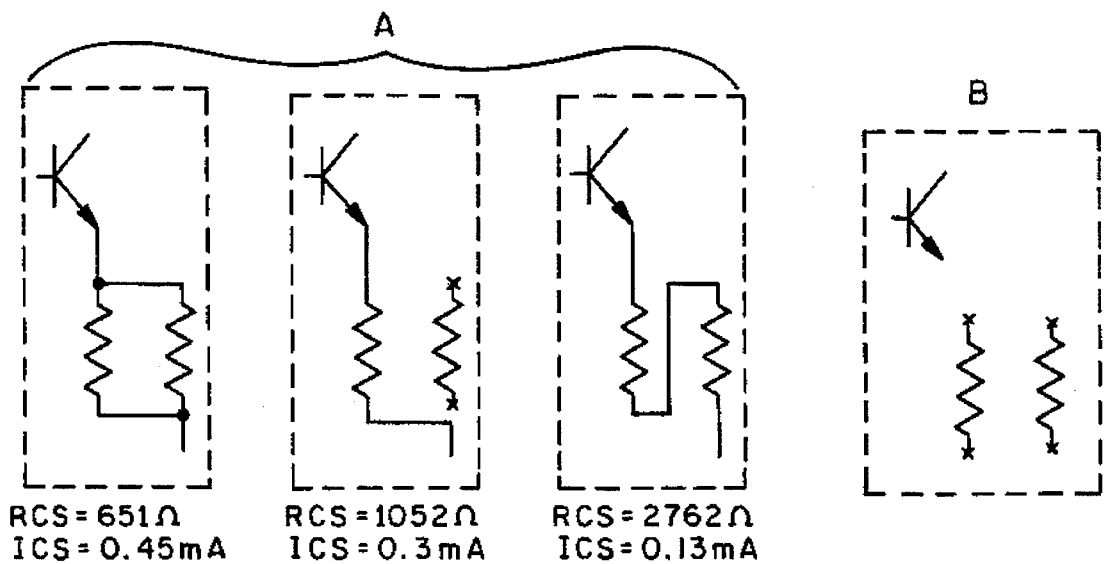
FIG. 8 is a diagram showing various alternative configurations of the current-switch circuit shown in FIG. 6.

Resistance value library 105 holds all possible configurations of emitter-follower and current-switch circuits available for each element. Each element can have any one of several different combinations of emitter-follower and current-switch circuits as explained below, in connection with FIGS. 7 and 8. The number of combinations may vary from element to element. That is, some elements have nine combinations and other elements six. The resistance value library 105 holds information defining these possible combinations for each element, as well as the alternative resistance values which comprise each combination.

The libraries provide an input to control device 101. The clock signal input module 106 inputs the clock signal library 102 to prepare the clock signal table 116. The logic information input module 107 inputs the logic information file 103 to prepare the logic information table 117. The delay constant input module 108 inputs the delay constant library 104 to prepare the delay constant table 118. The resistance value input module 122 inputs the resistance value library 105 to prepare the resistance value table 123.

Figure 3:
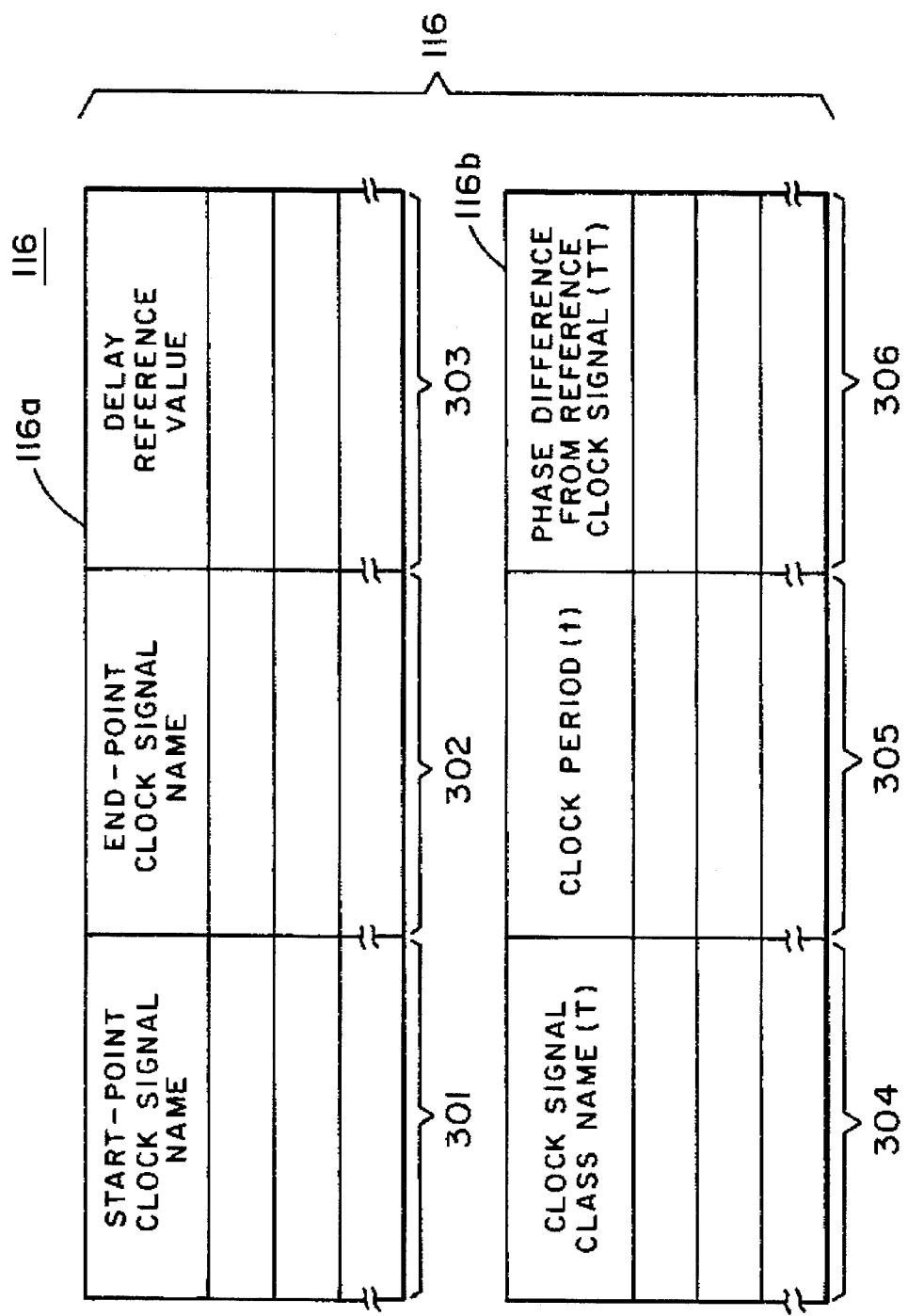
FIG. 3 is an explanatory diagram of a clock signal table.

FIG. 3 shows the format of the clock signal table 116. The clock signal table 116 is prepared on the basis of the content of the clock signal library 102 by the clock signal input module 106. The table 116 has two tables, a regular clock signal table 116a and an input/output terminal clock signal table 116b. As explained below, table 116a is used by the delay reference value setting module 109 to obtain the delay reference value for a particular path. Table 166b is used to obtain the delay reference value when the particular path's start or end point is an input or output terminal.

Each record of table 116a includes a start-point clock signal name field 301, an end-point clock signal name field 302, and a delay reference value field 303.

Each record of input/output terminal clock signal table 116b includes a clock signal class name field 304, a clock period field 305, and a phase-difference field 306 (that is, phase-difference as measured from the reference clock signal).

Figure 13:
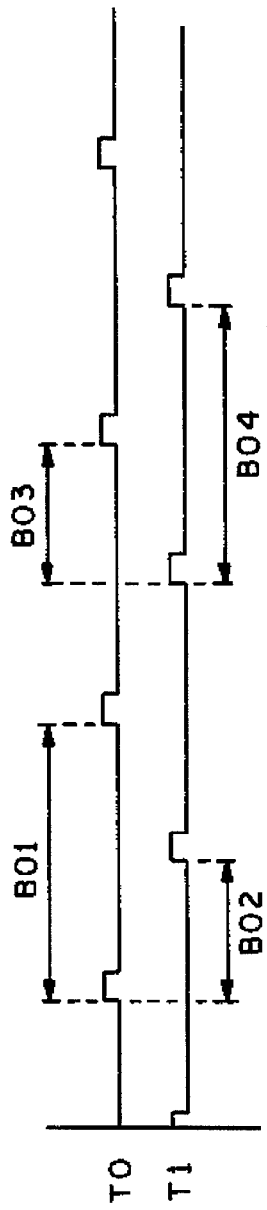
FIG. 13 is a timing diagram of two clock signals.

For example, two clock signals T0 and T1 are shown in FIG. 13 (T0 is assumed to be the reference clock signal). The clock period of T0 is B01, and the phase difference of T0 from the reference clock is b 0. The clock period of T1 is B04 and the phase difference of T1 from the reference clock is B02. The clock signal input module 106 uses this data (which is defined in the clock signal library 102) to calculate the delay reference value. Here the delay reference value from T0 to T0 is B01, the delay reference value from T0 to T1 is B02, the delay reference value from T1 to T0 is B03 and the delay reference value from T1 to T1 is B04. As explained above, the delay reference value is illustrated by the broken line of FIGS. 15 and 16.

Figure 4:
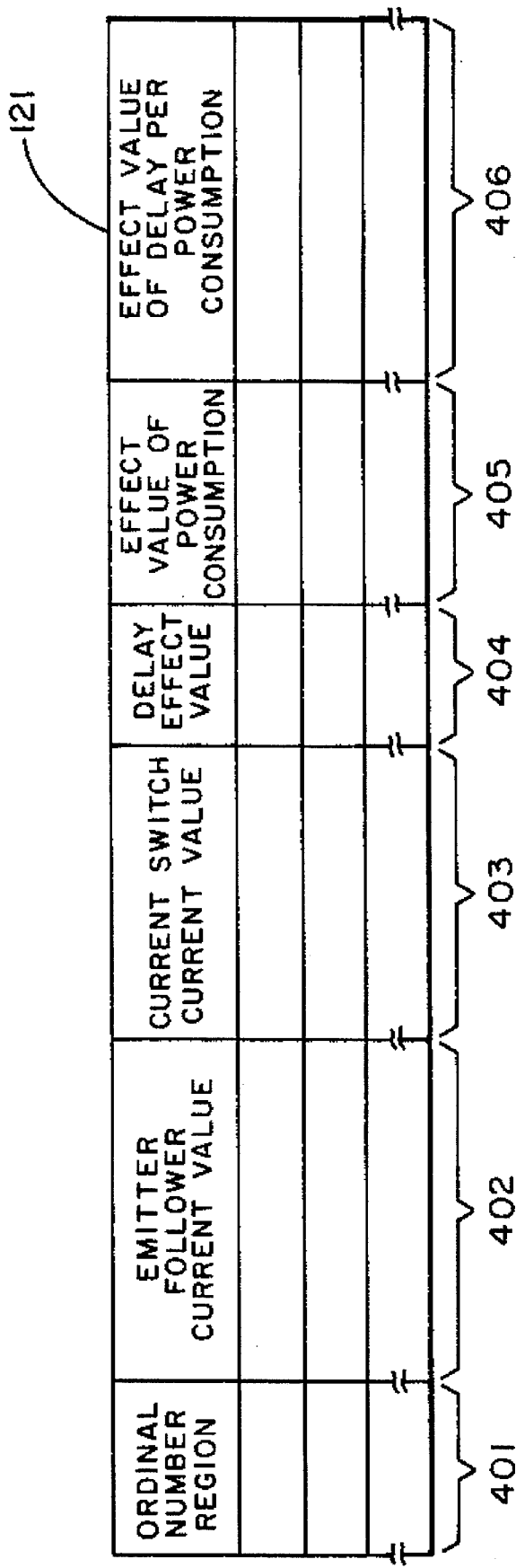
FIG. 4 is an explanatory diagram of an effect table.

FIG. 4 shows the format of effect table 121 prepared by the effect calculating module 111. Effect table 121 contains data pertaining to a particular path. For each element of the path, the effect table 121 provides data on the change in power consumption and delay time (that is, the "effect value") which results from all possible combinations of emitter-follower and/or current-switch currents. Each record of effect table 121 has an ordinal-number field 401 to associate the record with a particular element, an emitter-follower current value field 402, a current-switch current value field 403, a delay effect value field 404 for storing a delay effect value when the current values contained in fields 402 and 403 are used, a power-consumption effect value field 405 for storing an effect value of power consumption, and a field 406 for storing an effect value representing a delay effect per unit power consumption.

The ordinal number stored in field 401 corresponds to the ordinal number of an element in a particular path. The storage element (or, as the case may be, an input/output terminal) at the start point is set to "1". The number is incremented by "1" for each successive element along the path. The delay effect value corresponds to the difference between the delay before alteration of the current value and the delay after the alteration, and the effect value of the power consumption corresponds to the difference between the power consumption before alteration of the current value and the power consumption after the alteration. The effect value delay per unit power consumption corresponds to a value obtained by dividing the delay effect value by the effect value of the power consumption.

Here, for example, an element having such a construction that both current values of the emitter-follower current and the current-switch current can be altered will be described. It is assumed that the resistance value table 123 defines three kinds of resistance values for both emitter-follower current and current-switch current as for a certain element. Thus, there are nine combinations of the current values which each element can adopt. One combination is previously defined in the logic information file 103, therefore the effect calculating module 111 calculates various effect values for the other eight combinations and the obtained data is stored into the effect table 121 for each of these eight combinations. If there are more possible resistance values, the current values could be more finely altered, and the delay values can be matched more closely to the delay reference values.

Figures 5, 6:
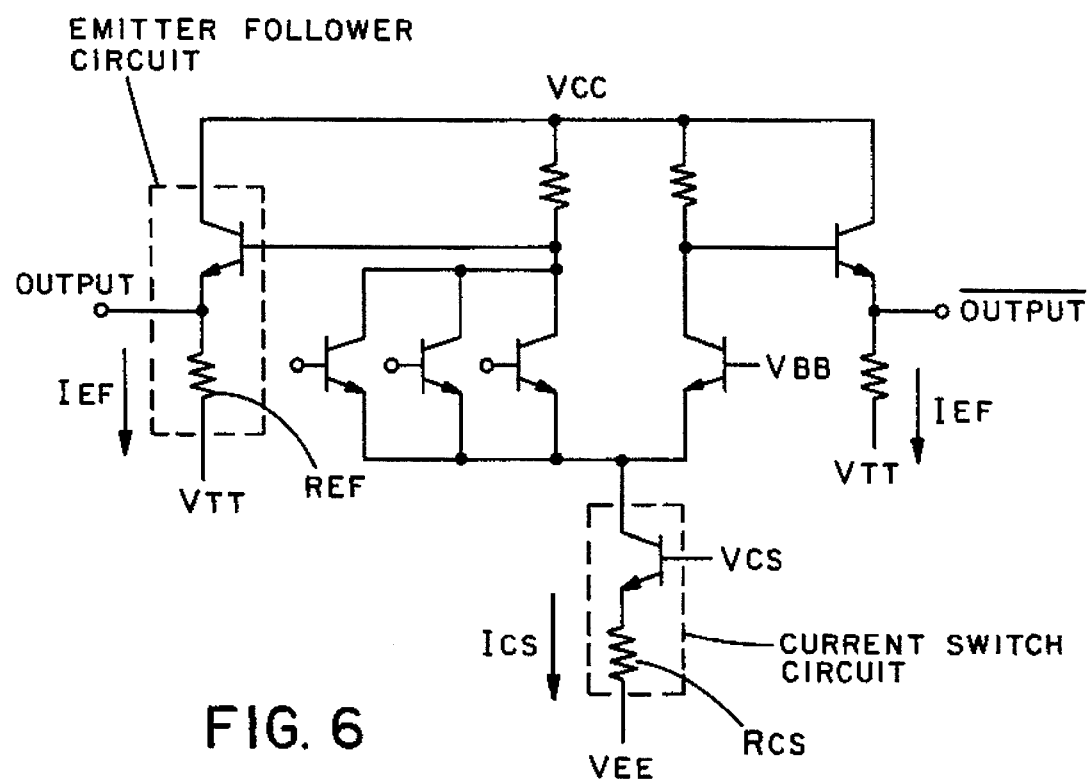
FIG. 5 is an explanatory diagram of a logic information table.
FIG. 6 is a schematic diagram of an emitter-follower circuit and current-switch circuit of a typical circuit element.

FIG. 5 shows the format of the logic information table 117. Logic information table 117 includes an element name field 501, a positive emitter-follower current value field 502, a negative emitter-follower current value storing field 503 and a current-switch current value field 504. Both positive and negative emitter-follower currents value fields 501 and 502 are required in table 117 because, as shown in FIG. 6, the ECL circuits include both positive and negative outputs (that is, logically inverted outputs), and the emitter-follower current is individually defined for each output. The logic information table 117 also contains fields (not shown) describing the interconnections (including line length) between the elements.

FIG. 7A shows three emitter-follower circuits of the ECL circuit. Each circuit has a different resistance value and emitter-follower current value. The connection of resisters and transistors defines these values in spite of using the same resistances. FIG. 7B shows basic resisters and transistors which are commonly embodied in the semiconductor circuit and wired during wiring process to make a desired one of the circuits shown in FIG. 7A. The number of transistors to be connected in parallel is selected to adequately sink the desired amount of current.

FIG. 8A shows three type of current-switch circuits of the ECL circuit. Each circuit has different resistance values and current-switch current values. The connection of resisters and transistor defines these values in spite of using the same resistances. FIG. 8B shows basic resisters and transistor which are commonly embodied in the semiconductor circuit and wired during wiring process to make a desired one of the circuits certain connection as shown in FIG. 8A.

The delay reference value setting module 109 refers to the tables 117 and 116, obtains the clock signal applied to a storage element and its description respectively, determines the delay reference value, and stores the value into the delay reference value storing region 119. The delay calculating module 110 refers to the tables 117 and 118 to calculate estimated delay for the path described in the logic information table 117, and stores the calculation result into the delay storing region 120. The effect calculating module 111 refers to the logic information table 117, the delay constant table 118 and the resistance value table 123 to calculate an effect when the emitter-follower current or current-switch current is altered, and prepares the effect table 121.

The comparison module 112 compares the delay reference value from the delay reference value storing region 119 with the estimated delay from the delay storing region 120. If the estimated delay exceeds the delay reference value, the delay shortening current control module 114 is invoked. If the estimated delay is less than the delay reference value, the power-consumption reducing current module 113 is invoked. Both modules 113 and 114 refer to the effect table 121 to select a combination of the emitter-follower and current-switch currents. The logic information table 117 is updated to reflect these new current values. The output module 115 outputs the content of the logic information table 117 to the logic information file 103.

Figure 2:
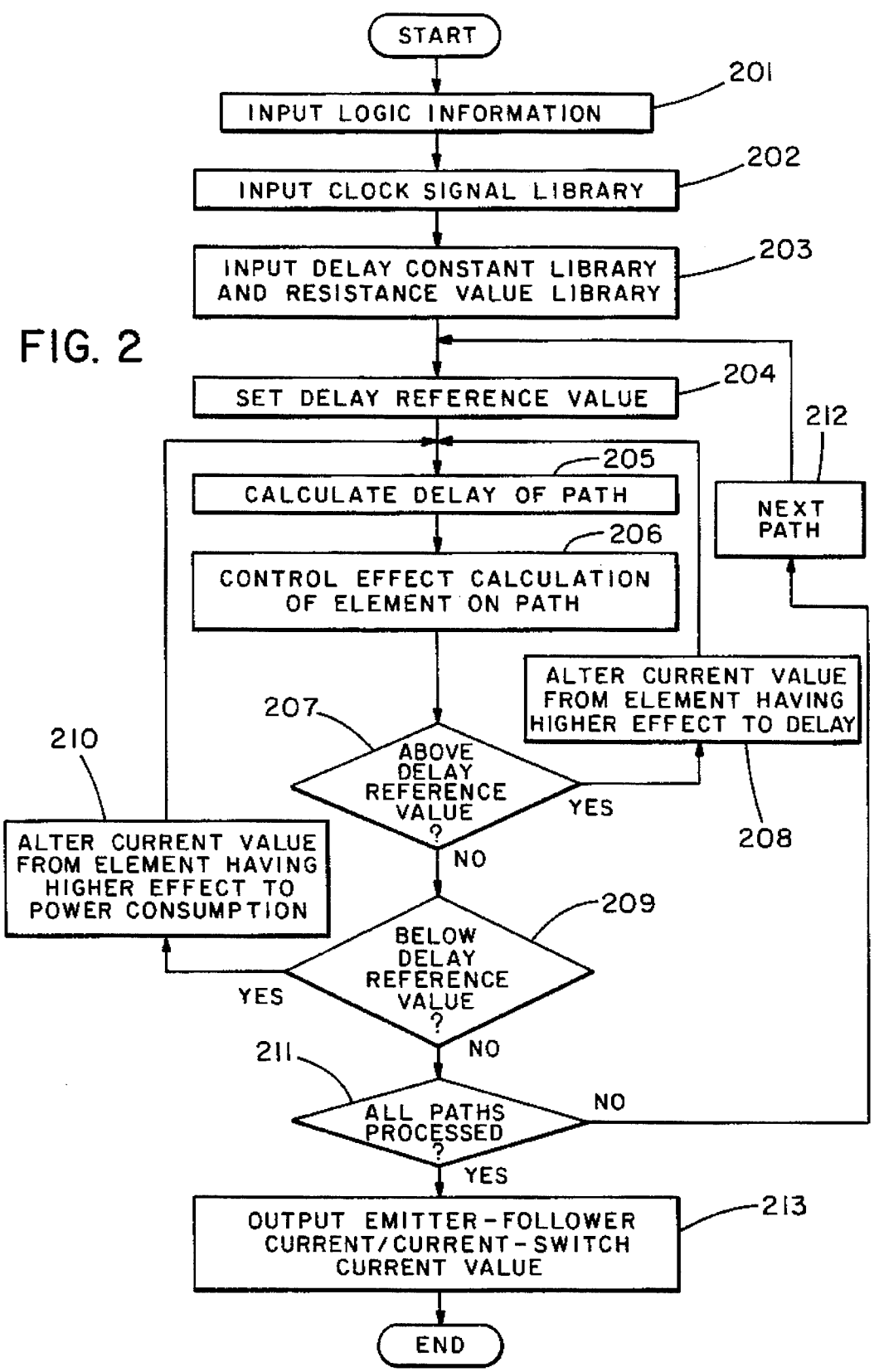
FIG. 2 is a logic flow chart illustrating the operation of the system of FIG. 1.
Figure 15:
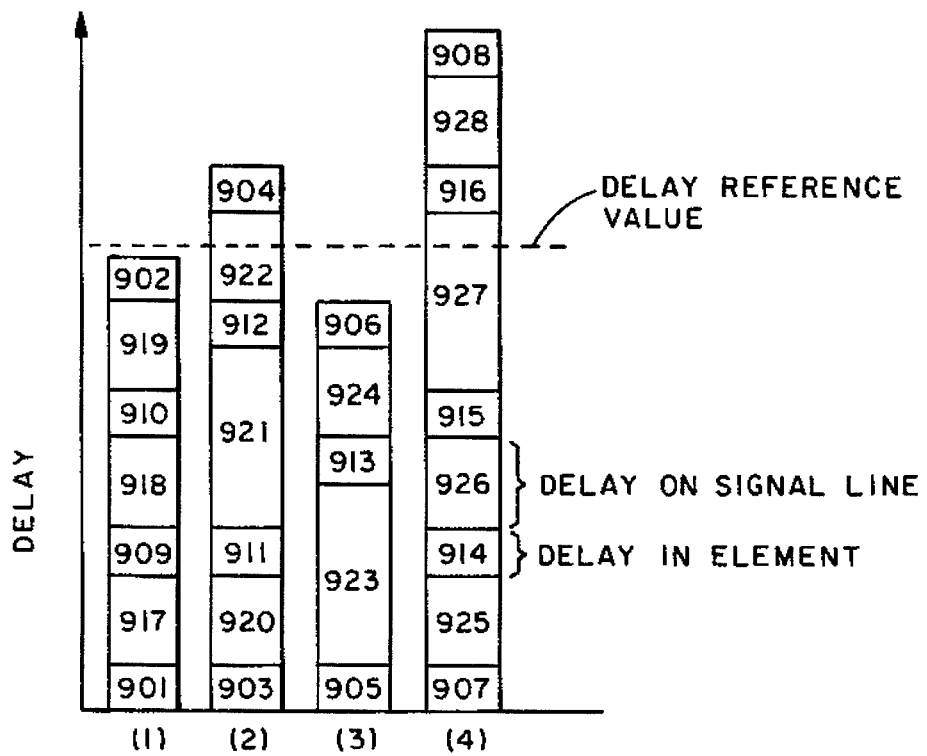
FIG. 15 is a bar graph showing delay of paths (1)–(4) of FIG. 11 before adjustment of emitter-follower current.
Figure 16:
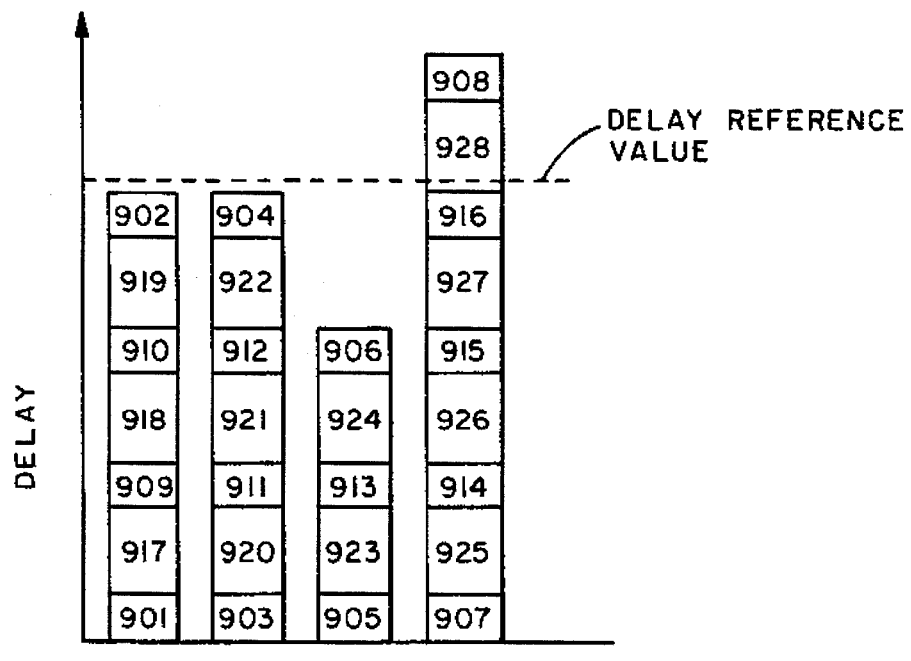
FIG. 16 is a bar graph showing delay of paths (1)–(4) of FIG. 11 after adjustment of emitter-follower current in accordance with conventional techniques.
Figure 17:
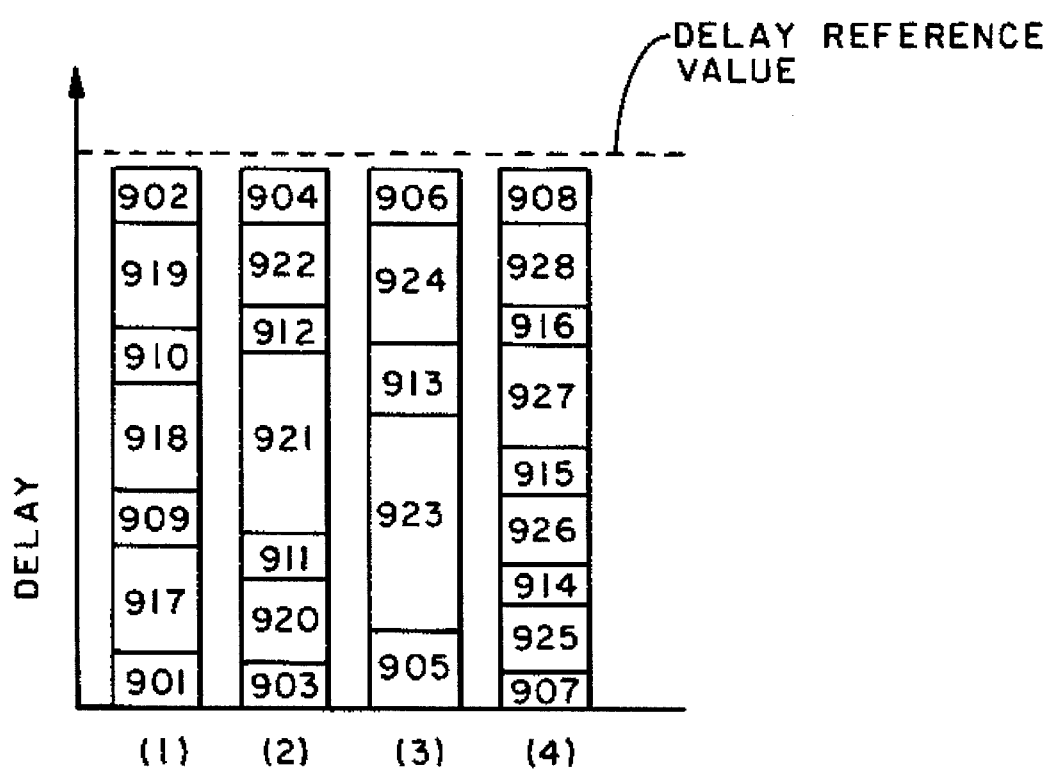
FIG. 17 is a bar graph showing delay of path (1)–(4) of FIG. 11 after adjustment of emitter-follower and current-switch currents in accordance with the present invention.

An embodiment of the process procedure of the delay optimizing method of the embodiment as shown in FIG. 2 will be described with reference to FIGS. 11, 15 and 17 using path (1) of FIG. 11 as an example.

First, the logic information input module 107, the clock signal input module 106, the delay constant input module 108 and the resistance value input module 122 conduct the input processing (at blocks 201, 202 and 203) on the logic information file 103, the clock signal library 102, the delay constant library 104 and the resistance value library 105 respectively, thereby preparing the logic information table 117, the clock signal table 116 and the delay constant table 118, respectively.

Next at block 204, the delay reference value is determined for the path (1) extending from the storage elements 901 to 902. The delay reference value setting module 109 refers to the logic information table 117 to determine the clock signal (here, T0) of the storage element 901 at the path start point and the clock signal (here, T1) of the storage element 902 at the path end point. The module 109 searches clock signal table 116 for the record having the same combination (that is, a start point having clock signal T0 and an end point having clock signal T1). The delay reference value of that record is selected as the delay reference value of the path (1), and stored in delay reference value storing region 119.

At block 205, the delay calculating module 110 refers to the logic information table 117 and the delay constant table 118 to calculate the delay before alteration of the current values of the path (1), and stores the result into the delay storing region 120.

At block 206, the effect calculating module 111 prepares the effect table 121 using the information contained in the resistance value table 123, module 111 calculates: (a) the possible combinations of emitter-follower current values and/or the current-switch current values which are available for each logic element on the path; (b) the change (that is, the "delay effect") in delay of the path for each possible combination, (c) the change in power consumed (that is, the "power-consumption effect") for each possible combination; and (d) the delay effect per unit of power consumption effect (that is, the value of (b) divided by the value of (c)).

At block 207, the comparison module 112 compares the estimated delay of the path (1) with the delay reference value of path (1) to determine whether the estimated delay exceeds the delay reference value.

If the delay exceeds the reference value, the control moves to block 208, where the delay shortening current control module 114 selects new current values to reduce delay. The delay shortening current control module 114 refers to the effect/power field 406 of effect table 121 (shown in FIG. 4). Module 114 locates the record of table 121 which has the greatest reduction in delay for the least increase in power consumption. The control module 114 updates the element associated with that record by replacing the current values for that element in the logic information table 117 with the new combination from effect table 121. The control module 114 returns the process to the step 205. The control then moves to block 205. The steps 205–208 are repeated until the estimated path delay is below the delay reference value. Control then proceeds to block 209.

At block 209, comparison module 112 checks whether the estimated delay of the path (1) is below the reference value even after the current value is altered (209). If the estimated delay after alteration of the current value is below the delay reference value, the control moves to block 210, where power-consumption reducing current control module 113 reduces the power consumption. Control module 113 refers to the delay effect/power field 406 of effect table 121, and finds an element having an available combination of current values which can reduce the power consumption with the slightest increase of delay value. That is, an element to be selected is an element for which a unit change in power-consumed results is the least increase in delay. Further, the control module 113 replaces the current values for that element in the logic information table 117, using the new combination of current values obtained from the effect table 121. Thereafter, control returns block 205 to repeat the steps 205 to 210 until the delay power-consumption cannot be increased without the estimated delay exceeding the delay reference value after alteration of the current value exceeds the delay reference value (this return path is not disclosed in FIG. 2 ).

For path (1), the delay after additional alteration of the current values will exceed the delay reference value, and thus the result of the comparison processing at block 209 is "No". At block 211, the repetitive processing control module checks whether there are any additional paths to process. At step 212, if any unprocessed path remains, it is loaded and the processing steps 204 to 212 are repeated until all the paths are completely processed.

If at block 211, all paths have been processed, then control moves to block 213, where output module 115 refers to the content of the logic information table 117 for all elements of the path to output the value of the emitter-follower current and the value of the current-switch current for the elements to the logic information file 103.

Figure 11:
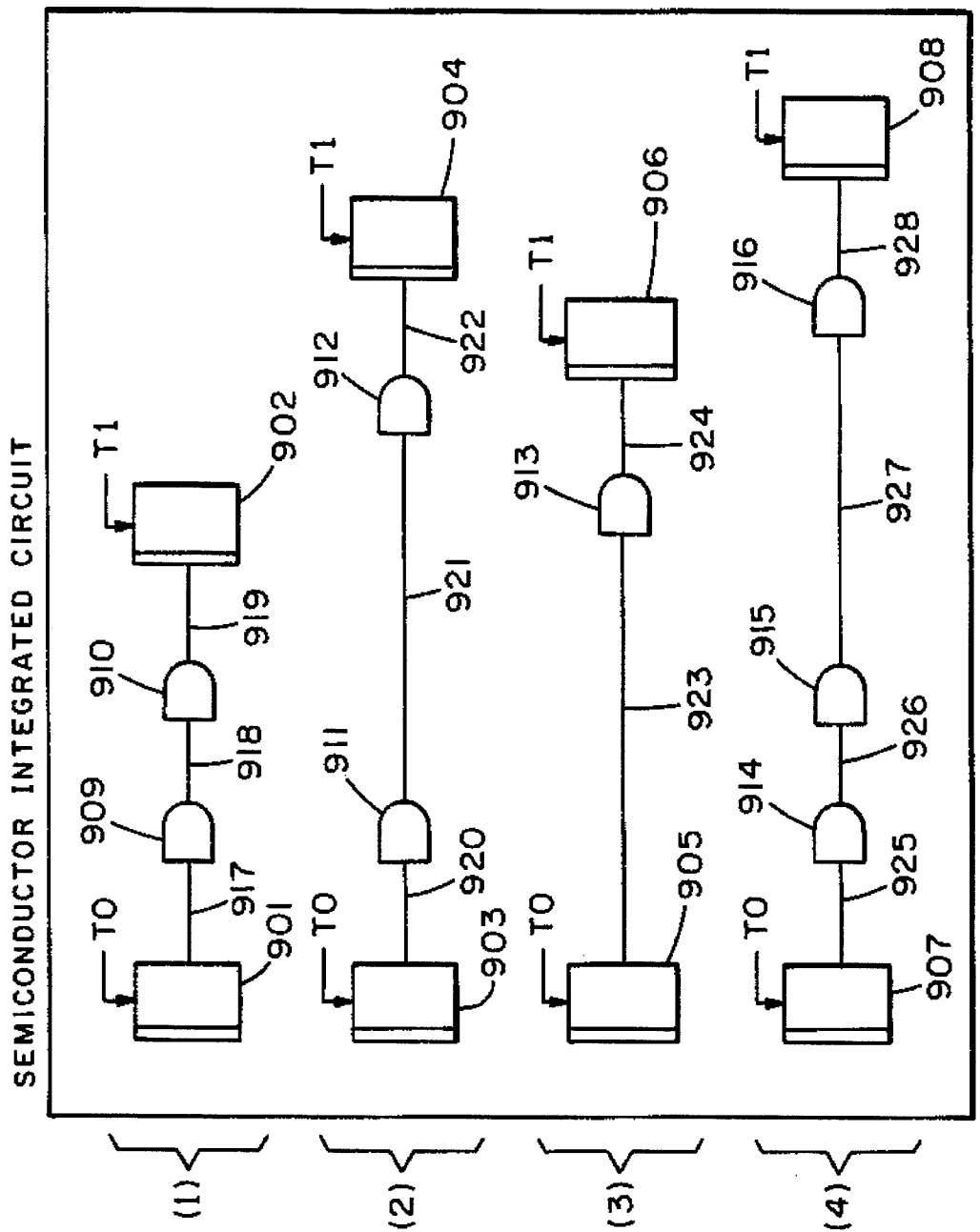
FIG. 11 is an idealized block diagram of four paths containing circuit elements and connecting lines.

For the path (2) extending from the storage element 903 to the storage element 904, as shown in FIG. 11, the delay reference value is set (204), the delay of the path is calculated (205) and the effect of the current alteration to the element on the path is calculated (206). Because the delay of path (2) exceeds the delay reference value, control moves to block 208. There, the delay shortening current control module 114 refers to the effect table 121 to select the element for with which the delay can be shortened at the highest power efficiency. Further, control module 114 updates the current values for the selected element on the logic information table 117 using the new combination of the current values from the effect table 121 (at block 208), and the process returns to the step 205. By repeating the steps 205 to 208, the estimated delay of path (2) can be reduced below the reference value (as shown by bar (2) of FIG. 17) with a minimum increase in power consumption.

For path (3) extending from the storage element 905 to the storage element 906 as shown in FIG. 11, if the comparison processing at block 207 is conducted after the processing steps 204 to 206 are carried out, the result is "No". Control moves to block 209. Therefore, referring to delay effect/ power field 406 of effect table 121, an element having a combination of the current values which can reduce the power consumption with the least increase of delay value is selected. Further, the control module 113 updates the current values for the element on the logic information table 117, repeating steps 205 to 210. The greatest reduction in power consumption is relayed without having the estimated delay exceed the delay reference, as shown in FIG. 17.

For path (4) extending from the storage element 907 to the storage element 908 as shown in FIG. 11, if the comparison processing at block 207 is conducted after the steps 204 to 206 are carried out, the comparison result is "Yes". In this case, the control moves to block 208, where delay shortening current control module 114 reduces the estimated delay. The control module 114 refers to the delay effect/power field 406 table 121 to select that element having a combination of the current values which shortens the estimated delay with the least increase in power consumption. Further, the control module 114 updates the current values for the element on the logic information table 117 using the combination of the current values (208). By repeating steps 205 to 208, the increase of the power consumption of the element on path (4) necessary to reduce the delay can be minimized.

As described above, according to this embodiment, the estimated delay of each path is matched to the delay reference value, whether the delay is initially below or above the reference value. As a result, processing speed of the circuit is increased and power consumption is reduced.

In the embodiment as described above, the delay effect value per unit power consumption (field 406 of the effect table 121) is used as a reference for determining whether a particular element's current values should be altered. Alternatively, the delay effect value (field 404 of the effect table 121) may be used. This method is as follows. If the estimated delay of the path exceeds the delay reference value, the current alteration is started from the element for which the delay can be most shortened irrespective of the increase of the power consumption. Likewise, if the estimated delay of the path is below the delay reference value, the current alteration is started from the element having the smallest extension of the delay. Alternatively, the determining delay effect value (field 405) of the power consumption can be used to reduce the power consumption irrespective of the extension of the delay. Under this arrangement, the element is selected which has an available combination yielding the greatest reduction in power consumption.

Figure 14:
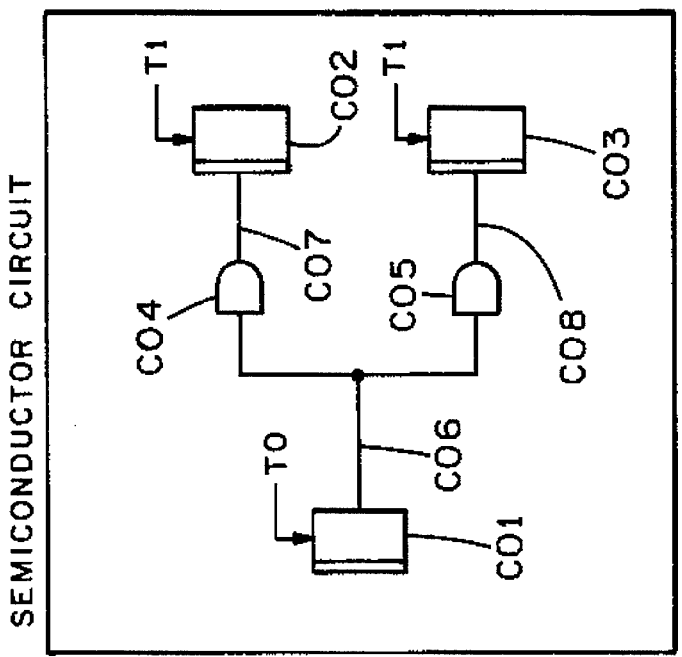
FIG. 14 is a block diagram of a semiconductor circuit designed using the present invention.

Another modification to the invention arises where an element is part of more than one path. For example, FIG. 14 shows two paths. One path extends from storage element C01 to storage element C02. The other path extends from storage element C01 to storage element C03. For purposes of illustration, we assume that the estimated delays of both paths exceed the delay reference value. If the emitter-follower current or current-switch current of the storage element C01 is controlled, delays of both paths can be reduced. Thus, storage element C01 becomes a first candidate to be selected to reduce delay and power consumption.

Figure 12:
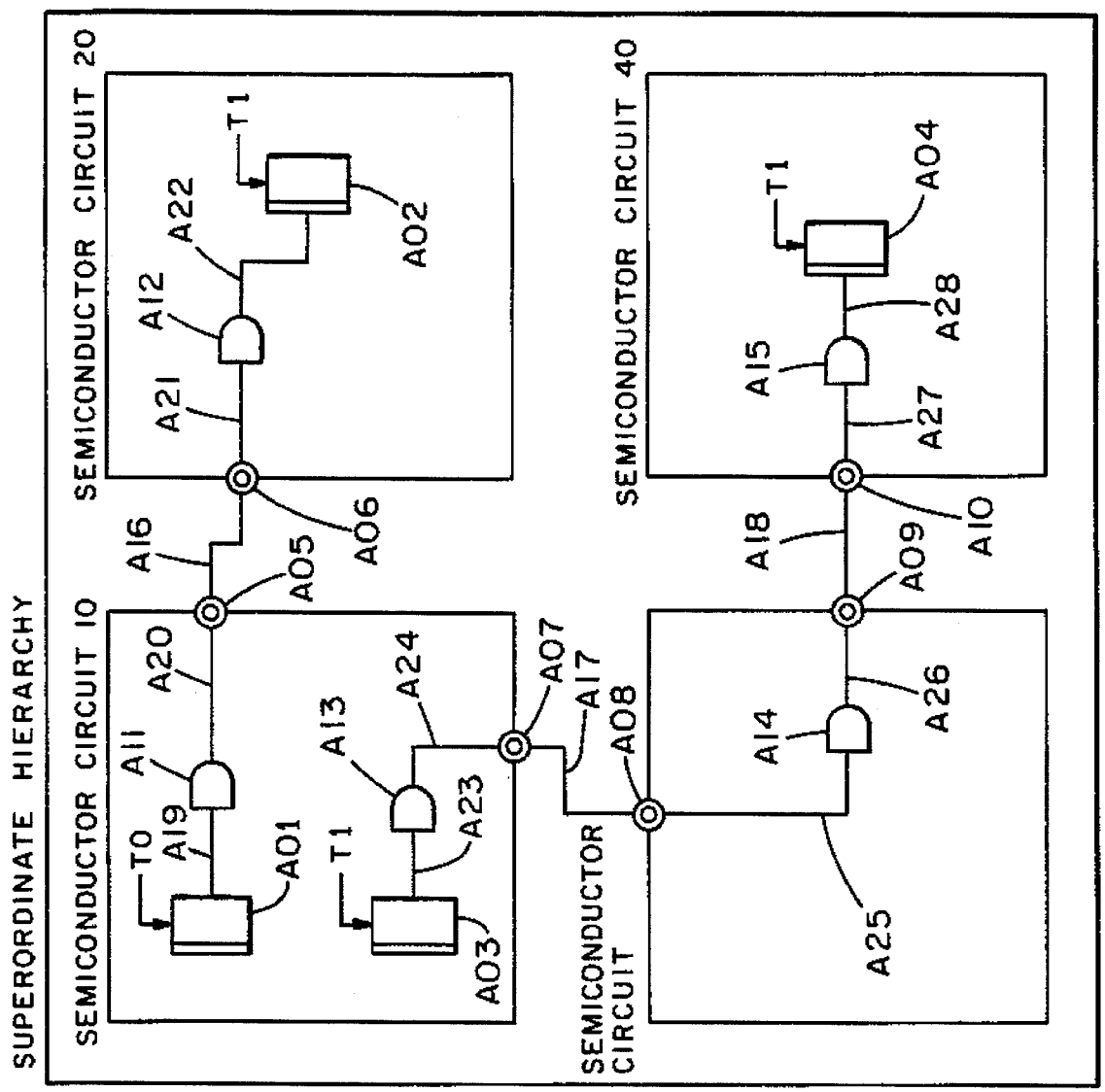
FIG. 12 is a simplified block diagram of semiconductor circuits designed using the present invention.

The invention is also useful when designing a circuit board containing several integrated circuits. Referring to FIG. 12, in the path extending from the storage element A01 to the storage element A02, both ends of the path are storage elements, and the delay reference value can be determined by comparing the phase difference of clock signals T0 and T1. However, a portion of the path is contained in a single semiconductor integrated circuit (as shown by the path portion spanning elements A01 to A05 for example). For these path portions, the start point or the end point, or both, are input/output terminals. Thus, the delay reference value cannot be set by the above method. Accordingly, in this case, the delay reference value of a path from A01 to A02 are previously calculated and stored in the library 103 as a propagate reference delay.

The delay reference value A01 to A05 can be calculated using a signal passing target time of the semiconductor integrated circuit, for example. This calculation method will be described hereunder.

First, the signal passing target time at the terminal portion A05 of the semiconductor integrated circuit is calculated. That is, the delay reference value for the whole path from A01 to A02 and path from A05 to A06 are obtained from the library 103, the later is subtracted from the former, the delay value of path from A01 to A05 and A06 to A02 are calculated based on the files 103 and 104, and the remainder is prorately allocated to each input/output terminal in accordance with the calculated delay reference values at the input/output terminal position, whereby the signal passing target time at the input/output terminal position A05 of the semiconductor integrated circuit can be calculated (See Japanese Patent Application No. 3-314301).

In some portions the end point is the input/output terminal as in the path that extends from the storage element A01 to input/output terminal A05 (which acts as an end point). The delay reference value setting module 109 uses clock signal table 116 (FIG. 3) to determine the delay reference value of the path between A01 and A05. This calculation uses the phase-difference ($t_{T0}$) between the clock signal T0 and the reference clock signal, the clock period (t) of clock signal T0, and the signal passing target time ($t_{05}$) of the input/output terminal A05:

for $t_{05} > t_{T0}$,
   the delay reference value T of path=$t_{05}-t_{T0}$ for $t_{05} < t_{T0}$,
   the delay reference value T of path=$t_{05}+t-t_{T0}$ In other path portions, where the start point is an input/output terminal, as for example, like the path extending from input/output terminal A06 to storage element A02 in FIG. 12. The delay reference value setting module 109 uses clock signal table 116 to set the delay reference value of the path between terminal A06 and storage element A02. This calculation uses the signal passing target time ($t_{06}$) of the input/output terminal A06, the phase difference ($t_{T1}$) between the clock signal T1 and the reference clock signal, and the clock period (t) of T0:

for $t_{T1} > t_{06}$,
   delay reference value T of path=$t_{T1}-t_{06}$ for $t_{T1} < t_{06}$,
   delay reference value T of path=$t_{T1}+t-t_{06}$ In yet other paths, the input/output terminals serve as the start and end points, as for example, in the path extending from the input/output terminal A08 to the input/output terminal A09 in FIG. 12, the start point is terminal A08, and the end point is terminal A09. Delay reference value setting module 109 sets the delay reference value of the path between terminal A08 and A09 using the following variables: signal, passing target time ($t_{o8}$) of the input/output terminal A08, and the signal passing target time ($t_{o9}$) of the input/output terminal A09 therein:

delay reference value T of path=$t_{o9}$−$t_{o8}$

According to this invention, the delay of a path can be set below the delay reference value, and the variance of the delay of the individual paths can be reduced to provide high speed semiconductor design. Further, the power consumption of the semiconductor integrated circuit can be reduced, and thus the power consumption of a device using a semiconductor integrated circuit such as a computer can be reduced. By using less power, less heat is generated. Consequently, in an apparatus requiring a cooling device, the cooling device can be designed in compact size, and thus the apparatus itself can be smaller and less expensive.

According to this invention, by controlling the emitter-follower current value and/or the current-switch current value for an element on a path of a semiconductor integrated circuit, the variance of the delay of the path can be reduced, the speed of the semiconductor integrated circuit can be increased, and the power consumption of the circuit can be reduced.

We claim:

1. In a design support system for designing a semiconductor integrated circuit containing a plural closed paths which are defined as a signal transmission passageway between storage elements, the system comprising:

clock signal library for holding information describing identities, clock signal periods and phase differences of clock signals which are used in the semiconductor circuit;

logic information file for holding information describing type of gate elements, connective relations thereof, and identities of clock signals served to storage elements of the plural paths;

table for holding information describing information representing variations of emitter-follower current of the gate elements and the storage elements;

means for obtaining delay reference value for a path, wherein clock signal identities of storage elements of the path read out from the logic information file specifies clock signal period and phase difference of the clock signals in the clock signal file, and time difference between the clock signals is obtained as the delay reference value based on the specified information;

means calculating a delay for a path based on connective relations of gate elements, emitter-follower current, wherein a plural types of delay may be obtained for the variations of the emitter-follower current defined in the table;

means for determining one variation of emitter-follower current so that path delay under the circumstance can have a predetermined relationship with the reference path delay.

2. In a design support method for designing a semiconductor integrated circuit containing a plural closed paths which are defined as a signal transmission passageway between storage elements, the method comprising the steps of:

preparing clock signal library describing identities, clock signal periods and phase differences of clock signals which are used in the semiconductor circuit;

preparing logic information file describing type of gate elements, connective relations thereof, emitter-follower and current-switch current thereof and identities of clock signals adapted to storage elements of the plural paths;

preparing table describing information representing variations of emitter-follower current and current-switch current of the gate elements and the storage elements;

obtaining delay reference value for a path, wherein clock signal identities of storage elements of the path read out from the logic information file specifies clock signal period and phase difference of the clock signals in the clock signal file, and time difference between the clock signals is obtained as the delay reference value based on the specified information;

calculating delay of a path based on connective relations of gate elements, emitter-follower current and current-switch current from the logic information file;

comparing the calculated delay with the delay reference value to determine whether relation between these two is a predetermined relation;

selecting another combination of emitter-follower current and current-switch current from the variation defined in the library, when the result of the comparison is unsuccessful; and repeating the comparison step, the calculating step and the selecting step until the result of comparison is success.

3. The design support method of claim 2, wherein the semiconductor circuit contains an open path defined as a signal transmission passageway between a storage element to an external terminal of the semiconductor circuit, the method comprises the steps of:

obtaining a closed path which includes the open path, wherein the obtained closed path may lie between the storage element in the semiconductor circuit and a storage element outside of the semiconductor circuit;

calculating a whole delay value for the obtained closed path based on clock signal period and phase difference between clock signals adapted to the storage elements;

proportionally sharing the whole delay value in accordance with content of the obtained closed path to calculate a delay reference value for the open path in the semiconductor integrated circuit.

4. The design support method of claim 2, further comprising the steps of obtaining a effect value for each set of the combination of a emitter-follower current and current-switch current of each element, wherein the effect value represents increase or decrease of delay and power consumption.

5. The design support method of claim 3, wherein the method further comprises the step of, in the case where the delay of a path exceeds the delay reference value of the path, selecting an element that has the combination of current values in which the delay can be shortened with the slightest increase of power consumption, detecting whether a delay under the selected combination exceeds the delay reference value, and repeating the latest selecting step and detecting step until a delay under the selected combination is below the delay reference value.

6. The design support method of claim 3, wherein the method further comprises the step of, in the case where the delay of a path is below the delay reference value of the path, selecting an element that has the combination of current values in which the power consumption can reduce with the slightest increase of the delay, detecting whether a delay under the selected combination exceeds the delay reference value, and repeating the latest selecting step and detecting step until a delay under the selected combination exceeds the delay reference value.

* * * * *